(12) United States Patent
Park

(10) Patent No.: US 11,099,691 B2
(45) Date of Patent: Aug. 24, 2021

(54) DISPLAY DEVICE

(71) Applicant: SAMSUNG DISPLAY CO., LTD., Yongin-si (KR)

(72) Inventor: Changmin Park, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/798,116

(22) Filed: Feb. 21, 2020

(65) Prior Publication Data

US 2020/0192435 A1    Jun. 18, 2020

Related U.S. Application Data

(63) Continuation of application No. 15/849,116, filed on Dec. 20, 2017, now Pat. No. 10,585,457.

(30) Foreign Application Priority Data

Jul. 4, 2017    (KR) .................. 10-2017-0085066

(51) Int. Cl.
*G06F 3/044* (2006.01)
*G06F 1/16* (2006.01)
(Continued)

(52) U.S. Cl.
CPC ............ *G06F 3/044* (2013.01); *G06F 1/1641* (2013.01); *G06F 1/1652* (2013.01);
(Continued)

(58) Field of Classification Search
CPC .... G06F 1/1681; G06F 1/1652; G06F 1/1641; G06F 1/1616; G06F 3/044; H01L 27/323
See application file for complete search history.

(56) References Cited

U.S. PATENT DOCUMENTS 8,787,016 B2    7/2014    Rothkopf et al.
8,804,349 B2    8/2014    Lee et al.
(Continued)

FOREIGN PATENT DOCUMENTS

CN    105659187 A    6/2016
CN    105788457 A    7/2016
(Continued)

OTHER PUBLICATIONS

Chinese Office action issued in corresponding application No. CN 201810431728.8, dated Jun. 8, 2021, 6 pages.

*Primary Examiner* — Xuemei Zheng
(74) *Attorney, Agent, or Firm* — Lewis Roca Rothgerber Christie LLP

(57) ABSTRACT

A display device includes: a first supporting member; a second supporting member on the first supporting member and having a plurality of openings therein; a plurality of push units on the first supporting member and in the openings of the second supporting member; a third supporting member on the second supporting member; a display module on the third supporting member, the display module having non-folding regions adjacent each other in a first direction with a folding region therebetween; a hinge connected to the first and second supporting members overlapping the folding region, the hinge being providing a plurality of rotating axes extending in a second direction crossing the first direction; and a plurality of supporting bars connected to the third supporting member, the supporting bars extending in a third direction and being in the openings, the third direction crossing a plane parallel to the first and second directions.

21 Claims, 14 Drawing Sheets

(51) Int. Cl.
*H01L 27/32* (2006.01)
*G06F 3/041* (2006.01)

(52) U.S. Cl.
CPC .......... *G06F 1/1681* (2013.01); *H01L 27/323* (2013.01); *G06F 3/0412* (2013.01); *G06F 2203/04102* (2013.01); *H01L 2251/5338* (2013.01)

(56) References Cited

U.S. PATENT DOCUMENTS

| | | |
|---|---|---|
| 9,173,287 B1 | 10/2015 | Kim et al. |
| 9,179,559 B1 | 11/2015 | Kim |
| 9,204,565 B1 | 12/2015 | Lee et al. |
| 9,786,207 B2 | 10/2017 | Kim et al. |
| 9,811,119 B2 | 11/2017 | Seo |
| 9,874,906 B1* | 1/2018 | Hsu .................. G06F 1/1681 |
| 10,191,516 B2 | 1/2019 | Jang et al. |
| 2012/0002360 A1 | 1/2012 | Seo et al. |
| 2015/0233162 A1 | 8/2015 | Lee et al. |
| 2015/0241925 A1 | 8/2015 | Seo et al. |
| 2016/0216737 A1 | 7/2016 | Hayk et al. |
| 2018/0150106 A1 | 5/2018 | Jang et al. |
| 2018/0309861 A1* | 10/2018 | Lin .................. G06F 1/1681 |

FOREIGN PATENT DOCUMENTS

| | | |
|---|---|---|
| CN | 105788458 A | 7/2016 |
| CN | 106205384 A | 12/2016 |
| CN | 106486018 A | 3/2017 |
| KR | 10-1292974 | 8/2013 |
| KR | 10-2014-0050504 A | 4/2014 |
| KR | 10-2016-0035146 | 3/2016 |
| KR | 10-2016-0083318 | 7/2016 |
| KR | 10-1654891 | 9/2016 |

\* cited by examiner

DISPLAY DEVICE

CROSS-REFERENCE TO RELATED APPLICATION

This application is a continuation of U.S. patent application Ser. No. 15/849,116, filed Dec. 20, 2017, which claims priority to and the benefit of Korean Patent Application No. 10-2017-0085066, filed Jul. 4, 2017, the entire content of both of which is incorporated herein by reference.

BACKGROUND

1. Field

Aspects of embodiments of the inventive concept relate to a display device.

2. Description of the Related Art

Electronic devices, such as smartphones, digital cameras, notebook computers, navigation systems, and smart televisions, generally include an image display device for displaying an image to a user. The image display device is configured to generate an image and to provide the image to a user through a screen.

Various types of display devices have been recently developed. One example of such recently-developed display devices is a flexible display device configured to be curved (e.g., configured to be curvedly deformed), folded, or rolled. Because a shape of the flexible display device may be variously changed, the flexible display device has improved portability and convenience.

SUMMARY

Some embodiments of the inventive concept provide a display device configured to suppress deformation of a folding region of a display module. According to an embodiment of the inventive concept, a display device includes: a first supporting member; a second supporting member on the first supporting member and having a plurality of openings therein; a plurality of push units on and connected to the first supporting member and in the openings of the second supporting member; a third supporting member on the second supporting member; a display module on the third supporting member, the display module having non-folding regions adjacent each other in a first direction and a folding region between the non-folding regions; a hinge connected to center portions of the first and second supporting members that overlap the folding region, the hinge to provide a plurality of rotating axes that extend in a second direction crossing the first direction, the first and second supporting members being configured to rotate about the rotating axes; and a plurality of supporting bars connected to the third supporting member. The supporting bars extend in a third direction and are in the openings, and the third direction crosses a plane parallel to the first and second directions. The push units are configured to rotate about individual rotating axes that extend through end portions of the push units in the third direction, and the push units are closer to the rotating axes of the hinge than the supporting bars are.

According to another embodiment of the inventive concept, a display device includes: a first supporting member; a second supporting member on the first supporting member and having a plurality of openings therein; a plurality of push units connected to the first supporting member and in the openings; a third supporting member on the second supporting member, the third supporting member including a plurality of supporting bars extending in a downward direction into the openings; a display module on the third supporting member; and a hinge member connected to center portions of the first and second supporting members, the hinge member providing a plurality of rotating axes for rotation of the first and second supporting members. The push units are configured to rotate about individual rotating axes that extend through end portions of the push units and are closer to the rotating axes than the supporting bars are. The openings in the third supporting member are defined by a plurality of inner side surfaces of the third supporting members, and when the first, second, and third supporting members are unfolded about the rotating axes, the inner side surfaces that are closer to the rotating axes from among the inner side surfaces of the third supporting members push the push units in a direction away from a center of the display module and the push units push the supporting bars in the direction away from the center of the display module.

BRIEF DESCRIPTION OF THE DRAWINGS

Example embodiments of the inventive concept will be more clearly understood from the following brief description taken in conjunction with the accompanying drawings. The accompanying drawings illustrate non-limiting, example embodiments as described herein. In the drawings.

Figure 1:
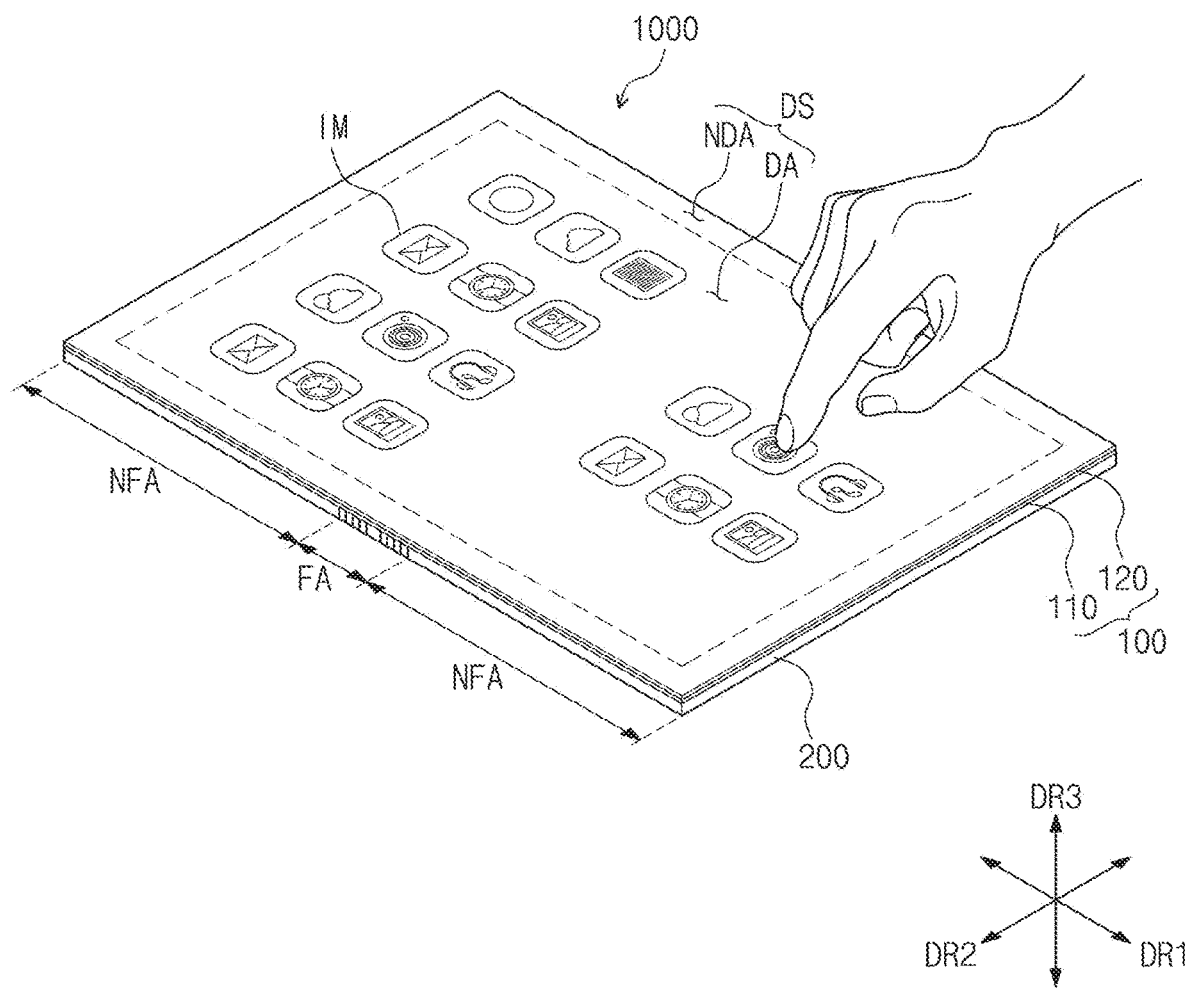
FIG. 1 is a perspective view of a display device according to an embodiment of the inventive concept.

It should be noted that these figures are intended to illustrate the general aspects and features of methods, structures, and/or materials utilized in example embodiments and to supplement the written description provided below. These drawings are not, however, to scale and may not precisely reflect the structural or performance characteristics of any given embodiment and should not be interpreted as defining or limiting a range of values or properties encompassed by example embodiments. For example, relative thicknesses and positioning of layers, regions, and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these exemplary embodiments are provided so that this disclosure will be thorough and complete and will fully convey the concept of the inventive concept to those of ordinary skill in the art.

It will be understood that when an element is referred to as being "connected" or "coupled" to another element, it can be directly connected or coupled to the other element or intervening elements may be present. When an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

It will be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly.

The terminology used herein is for the purpose of describing particular embodiments and is not intended to be limiting of example embodiments. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the singular forms "a" and "an" are intended to include the plural forms as well, unless the context clearly indicates otherwise. It will be further understood that the terms "comprises," "comprising," "includes," and/or "including," as used herein, specify the presence of stated features, integers, steps, operations, elements, and/or components but do not preclude the presence or addition of one or more other features, integers, steps, operations, elements, components, and/or groups thereof.

Example embodiments of the inventive concept are described herein with reference to cross-sectional illustrations that are schematic illustrations of idealized structures (and intermediate structures) of example embodiments. As such, variations from the illustrated shapes as a result, for example, of manufacturing techniques and/or tolerances, are to be expected. Thus, example embodiments of the inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and should not be interpreted in an idealized or overly formal sense unless expressly so defined herein.

Figure 2:
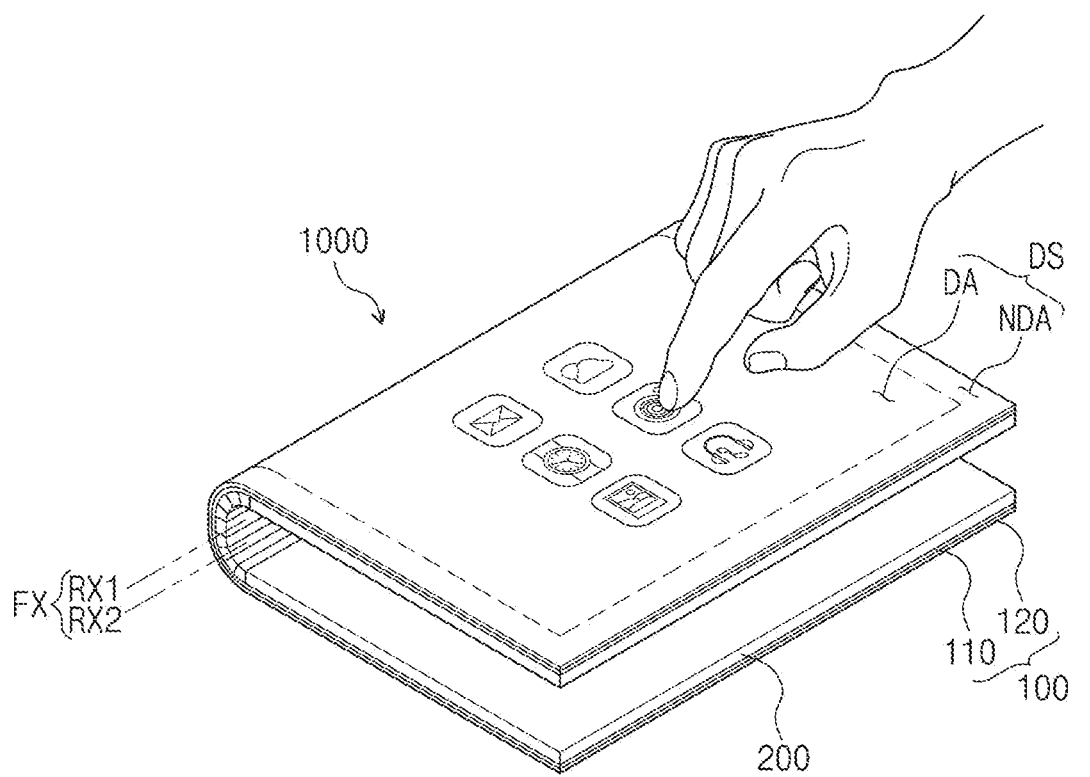
FIG. 2 is a diagram illustrating the display device shown in FIG. 1 in an outwardly-folded state (e.g., an out-folded state).

FIG. 1 is a perspective view of a display device according to an embodiment of the inventive concept. FIG. 2 is a diagram illustrating the display device shown in FIG. 1 in an outwardly-folded state (e.g., an out-folded state).

Referring to FIGS. 1 and 2, a display device 1000 may have a rectangular shape with first sides (e.g., long sides) that are parallel to a first direction DR1 and second sides (e.g., short sides) that are parallel to a second direction DR2 crossing the first direction DR1. However, the inventive concept is not limited thereto, and the display device 1000 may have various other suitable shapes. The display device 1000 may be a flexible display device (e.g., a foldable display device that is configured to be folded and unfolded about a folding axis FX parallel to the second direction DR2).

The display device 1000 may be divided into a plurality of regions according to its folded state. For example, the display device 1000 may be divided into a folding region FA, which is configured to be folded, and two non-folding regions NFA, which are maintained in a flat shape (e.g., which are rigid). The non-folding regions NFA may be arranged in (or adjacent each other) the first direction DR1, and the folding region FA may be positioned between the two non-folding regions NFA. In the illustrated embodiment, the display device 1000 has only one folding region, but the inventive concept is not limited thereto. For example, the display device 1000 may have a plurality of folding regions.

The folding axis FX may include a first rotating axis RX1 and a second rotating axis RX2, and the first and second rotating axes RX1 and RX2, which are two rotation axes of the display device 1000, are parallel to the second direction DR2 and are adjacent to each other. The folding region FA may overlap the first and second rotating axes RX1 and RX2, and the display device 1000 may be configured to be folded about the first and second rotating axes RX1 and RX2.

The display device 1000 may include a display module 100 and a supporting member 200 provided below the display module 100. A top surface of the display module 100 may be referred to as a display surface DS and may be parallel to the first and second directions DR1 and DR2 (e.g., may be parallel to the first and second direction DR1 and DR2 in a flat or unfolded state). The display surface DS may be at where images IM, which are generated by the display module 100, are displayed to a user.

The display surface DS may include a display region DA and a non-display region NDA near or around the display region DA. The display region DA may be configured to display an image, and the non-display region NDA may not be used to display an image. The non-display region NDA may be provided to enclose (e.g., surround a periphery of) the display region DA, thereby serving as an edge portion of the display device 1000, and may have a color, such as black.

The display module 100 may be flexible and may include a display panel 110 and a touch-sensing unit 120 provided on the display panel 110. The display panel 110 may be configured to generate an image and to provide the image to a user. The display panel 110 may be a liquid crystal display panel, an organic light emitting display panel, an electrophoresis display panel, an electrowetting display panel, or various other suitable display panels configured to display an image thereon.

The touch-sensing unit 120 may be configured to sense an external input (e.g., a user's hand, a touch pen, and so forth), to generate an input signal from the sensed external input, and to provide the input signal to the display panel 110. The touch-sensing unit 120 may include a plurality of touch sensor units (e.g., touch sensors or touch sensing units), which are configured to sense the external input. The touch sensor units may be configured to sense an external input in a capacitive manner. The display panel 110 may be configured to receive an input signal from the touch-sensing unit 120 and to generate an image based on the input signal.

The supporting member 200 may support the display module 100 and may be folded or unfolded by being rotated about the first and second rotating axes RX1 and RX2. When the supporting member 200 is folded, the flexible display module 100 may also be folded by the supporting member 200. The display device 1000 may be folded in an out-folding manner (e.g., may be outwardly folded) such that the display surface DS of the display module 100 is exposed to the outside by the supporting member 200.

A detailed structure of the supporting member 200 will be described in more detail with reference to FIGS. 5 and 6. Hereinafter, a direction perpendicular to the first and second directions DR1 and DR2 will be referred to as a third direction DR3.

Figure 3:
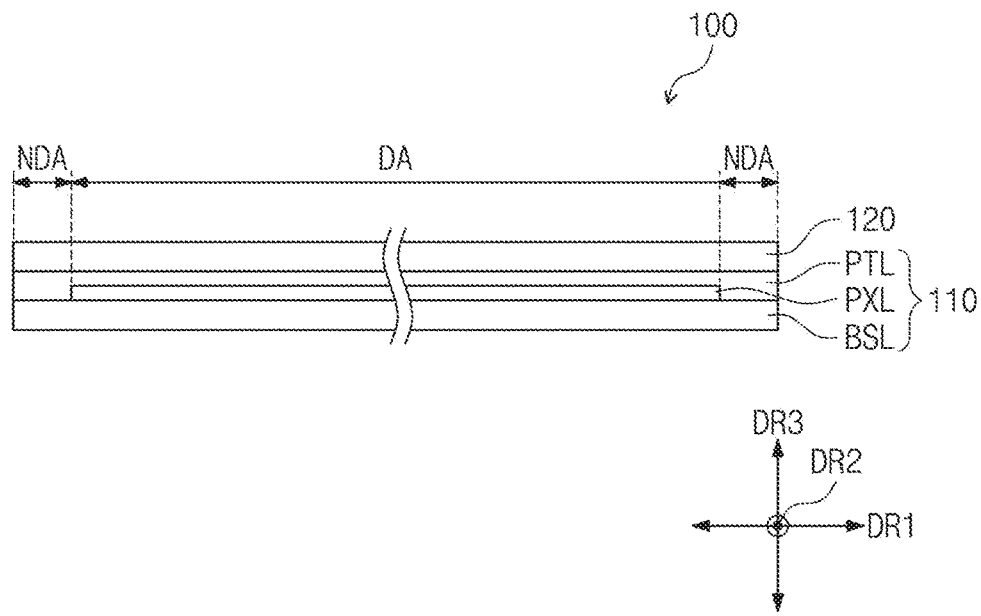
FIG. 3 is a sectional view of the display device shown in FIG. 1.

FIG. 3 is a sectional view of the display device shown in FIG. 1.

Referring to FIG. 3, the display panel 110 may include a base layer BSL, a pixel layer PXL provided on the base layer BSL, and a protection layer PTL provided on the base layer BSL to cover the pixel layer PXL.

The base layer BSL may define a rear surface of the display module 100 and may be flexible. The pixel layer PXL may include a plurality of pixels and may be configured to generate the images IM in response to electrical signals applied thereto. The protection layer PTL may be configured to protect the pixel layer PXL, and the touch-sensing unit 120 may be provided on the protection layer PTL. The protection layer PTL may be provided to have a multi-layered structure and may include at least one organic insulating layer and/or at least one inorganic insulating layer.

Figure 4:
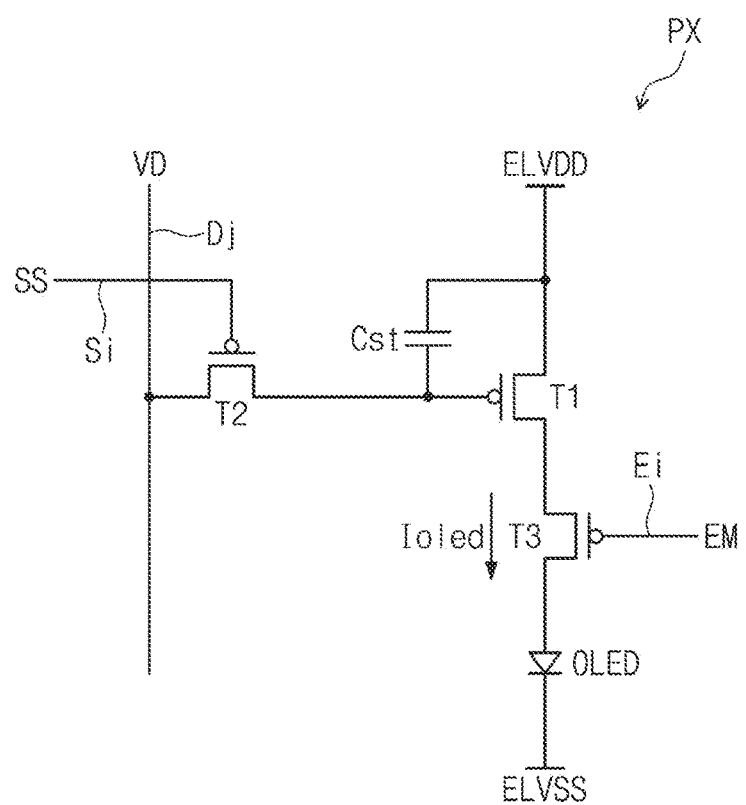
FIG. 4 is an equivalent circuit diagram of a pixel in a pixel layer shown in FIG. 3.

FIG. 4 is an equivalent circuit diagram of one of the pixels in the pixel layer PXL shown in FIG. 3.

In FIG. 4, a structure of one pixel PX is illustrated, but other pixels in the pixel layer PXL may have the same structure as the pixel PX shown in FIG. 4. In some embodiments, the pixel PX shown in FIG. 4 may be an organic light emitting device used in an organic light emitting display panel.

Referring to FIG. 4, the pixel PX may be connected to a scan line Si, a data line Dj, and a light-emitting line Ei, where i and j are natural numbers. The pixel PX may include a light-emitting device OLED, a driving transistor T1, a capacitor Cst, a switching transistor T2, and a light-emitting control transistor T3. The light-emitting device OLED may be an organic light emitting diode.

A source terminal of the driving transistor T1 may have a first voltage ELVDD applied thereto, and a drain terminal of the driving transistor T1 may be connected to a source terminal of the light-emitting control transistor T3. A gate terminal of the driving transistor T1 may be connected to a drain terminal of the switching transistor T2.

A gate terminal of the switching transistor T2 may be connected to the scan line Si, and a source terminal of the switching transistor T2 may be connected to the data line Dj. A first electrode of the capacitor Cst may be connected to the source terminal of the driving transistor T1, and a second electrode of the capacitor Cst may be connected to the gate terminal of the driving transistor T1.

A gate terminal of the light-emitting control transistor T3 may be connected to the light-emitting line Ei, and a drain terminal of the light-emitting control transistor T3 may be connected to an anode electrode of the light-emitting device OLED. A cathode electrode of the light-emitting device OLED may have a second voltage ELVSS applied thereto. The second voltage ELVSS may have a lower voltage level than that of the first voltage ELVDD.

The switching transistor T2 may be turned on in response to a scan signal SS transmitted through the scan line Si. When the switching transistor T2 is turned on, a data voltage VD applied to the data line Dj may be provided to the gate terminal of the driving transistor T1 through the switching transistor T2. The capacitor Cst may be charged to the data voltage VD applied to the gate terminal of the driving transistor T1 and may be configured to maintain the data voltage VD even after the switching transistor T2 is turned off.

When a light-emitting signal EM is applied to the gate terminal of the light-emitting control transistor T3 through the light-emitting line Ei, the light-emitting control transistor T3 may be turned on in response to the light-emitting signal EM. In this case, a current Ioled may be supplied to the organic light emitting diode OLED from the driving transistor T1 through the light-emitting control transistor T3. The pixel PX may be configured to emit light during an applying period (e.g., an emission period) of the light-emitting signal EM, and an intensity of the light emitted from the light-emitting device OLED may depend on an amount of the current Ioled.

The transistors T1-T3 of the pixel PX may be PMOS transistors, but the inventive concept is not limited thereto. For example, the transistors T1-T3 of the pixel PX may be NMOS transistors.

Figure 5:
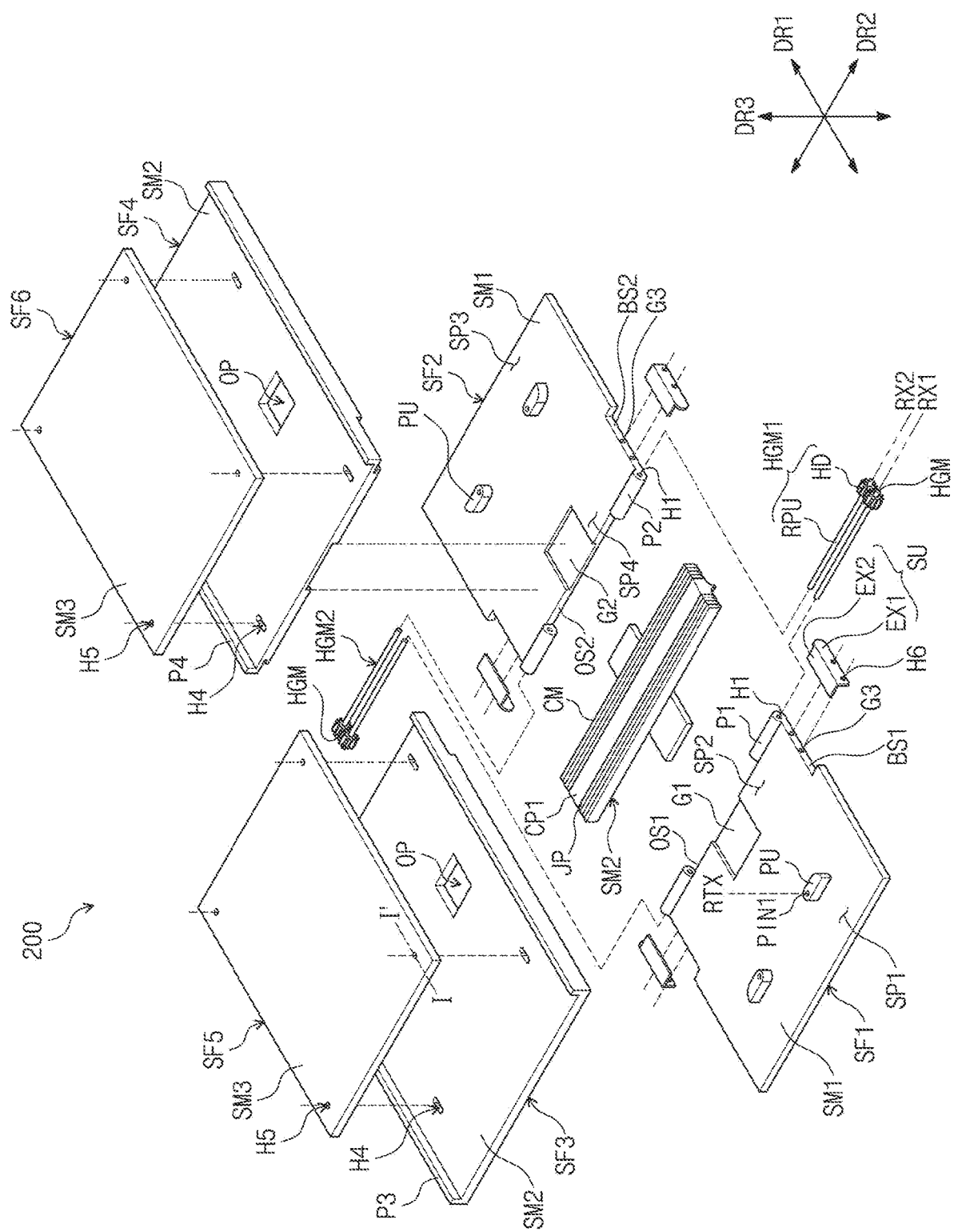
FIGS. 5 and 6 are exploded perspective views illustrating a supporting member shown in FIG. 1.
Figure 6:
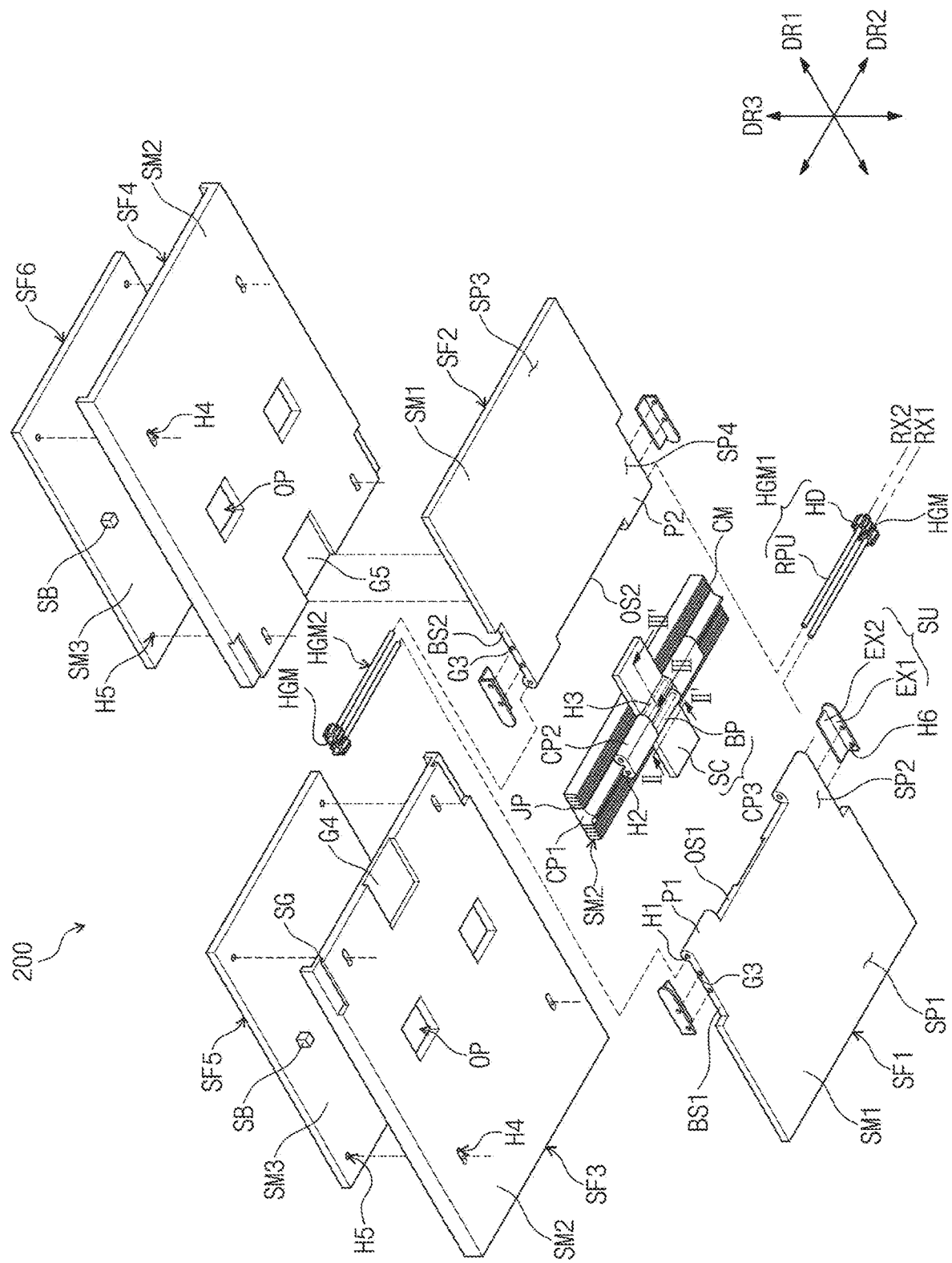

FIGS. 5 and 6 are exploded perspective views illustrating the supporting member 200 shown in FIG. 1.

More specifically, FIG. 5 is an exploded top-side perspective view of the supporting member 200, and FIG. 6 is an exploded bottom-side perspective view of the supporting member 200.

Referring to FIGS. 5 and 6, the supporting member 200 may include a first supporting member SM1, a second supporting member SM2, a third supporting member SM3, a hinge member HGM, a plurality of sliding units SU, a plurality of push units PU, and a plurality of supporting bars SB. The second supporting member SM2 may be provided on the first supporting member SM1, and the third supporting member SM3 may be provided on the second supporting member SM2. Each of the first, second, and third supporting members SM1, SM2, and SM3 may have a rectangular plate shape parallel to both of the first and second directions DR1 and DR2.

The hinge member HGM may be disposed to overlap the folding region FA of the display module 100 and may be used to connect center portions of the first and second supporting members SM1 and SM2 that overlap the folding region FA to each other. The hinge member HGM may provide the two rotating axes RX1 and RX2 for rotation of the first and second supporting members SM1 and SM2. The first and second supporting members SM1 and SM2 may be configured to rotate about the two rotating axes RX1 and RX2 as will be described in more detail below.

The push units PU may be provided on the first supporting member SM1 and may overlap a plurality of opening portions OP (e.g., openings) defined in the second supporting member SM2. Each of the push units PU may be connected to the first supporting member SM1 by a first pin unit PIN1 (e.g., a first pin). The first pin units PIN1 may be provided in end portions (e.g., side portions) of the push units PU and may extend in the third direction DR3, thereby providing rotating axes RTX. The push units PU may be configured to rotate about the respective first pin units PIN1 and the corresponding rotating axes RTX.

The first pin units PIN1 may extend in the third direction DR3, and the rotating axes RTX defined by the first pin units PIN1 may also extend in the third direction DR3. The third direction DR3 may be substantially orthogonal to the first and second directions DR1 and DR2.

The supporting bars SB may be connected to (e.g., may extend from) a bottom surface of the third supporting member SM3 and may extend in the third direction DR3. The supporting bars SB, along with the push units PU, may overlap the opening portions OP. The push units PU may be closer to the two rotating axes RX1 and RX2 than the supporting bars SB are, and this arrangement will be described in more detail below.

In the present specification, the terms "hole," "opening," and/or "opening portion" are used to refer to an empty region that is formed to penetrate or extend through an object, and the terms "recess" and/or "groove" are used to refer to an empty region that is formed by recessing a portion of a surface of an object by a predetermined depth but that does not extend through the object (e.g., a blind opening or a blind hole).

The first supporting member SM1 may include a first supporting frame SF1, a second supporting frame SF2, a plurality of first protruding portions P1, and a plurality of second protruding portions P2. The first and second supporting frames SF1 and SF2 may be arranged in the first direction DR1 and may be symmetric to each other.

The first protruding portions P1 may protrude from a side surface OS1 of the first supporting frame SF1, and the second protruding portions P2 may protrude from a side surface OS2 of the second supporting frame SF2. The side surface OS1 of the first supporting frame SF1 may be provided to face the side surface OS2 of the second supporting frame SF2 in the second direction DR2. As shown in FIGS. 5 and 6, the first supporting member SM1 may include a pair of the first protruding portions P1 and a pair of the second protruding portions P2, but the inventive concept is not limited to any specific number of first and second protruding portions P1 and P2.

The pair of the first protruding portions P1 may be spaced apart from each other in the second direction DR2 and may be provided adjacent to both ends of the side surface OS1 of the first supporting frame SF1 in the second direction DR2. The pair of the second protruding portions P2 may be spaced apart from each other in the second direction DR2 and may be provided adjacent to both ends of the side surface OS2 of the second supporting frame SF2 in the second direction DR2. Each of the first and second protruding portions P1 and P2 may have a hollow cylindrical shape extending in the second direction DR2. A first opening H1 (e.g., a first hole) extending in the second direction DR2 may be defined in each of the first and second protruding portions P1 and P2.

A first recess G1 may be defined in a region of a top surface of the first supporting frame SF1, and in some embodiments, the first recess G1 may be positioned at or near a center portion of the side surface OS1 of the first supporting frame SF1. When viewed in the first direction DR1, the first recess G1 may be between the first protruding portions P1 and may be defined from (e.g., may extend from) the side surface OS1 of the first supporting frame SF1.

A second recess G2 may be defined in a region of a top surface of the second supporting frame SF2, and in some embodiments, the second recess G2 may be positioned at or near a center portion of the side surface OS2 of the second supporting frame SF2. When viewed in the first direction DR1, the second recess G2 may be positioned between the second protruding portions P2 and may be defined from the side surface OS2 of the second supporting frame SF2.

The first supporting frame SF1 may include a first supporting portion SP1 and a second supporting portion SP2, which extends from the first supporting portion SP1 in the first direction DR1. When measured in the second direction DR2, a width of the second supporting portion SP2 may be smaller than that of the first supporting portion SP1. The side surface OS1 of the first supporting frame SF1 may be the side surface OS1 of the second supporting portion SP2, and the first recess G1 may be defined in a top surface of the second supporting portion SP2.

The second supporting frame SF2 may include a third supporting portion SP3 and a fourth supporting portion SP4, which extends from the third supporting portion SP3 in the first direction DR1. When measured in the second direction DR2, a width of the fourth supporting portion SP4 may be smaller than that of the second supporting portion SP2. The side surface OS2 of the second supporting frame SF2 may be the side surface OS2 of the fourth supporting portion SP4, and the second recess G2 may be defined in a top surface of the fourth supporting portion SP4.

The second supporting portion SP2 may include side surfaces BS1, which are defined as two surfaces opposite to each other in the second direction DR2, the fourth supporting portion SP4 may include side surfaces BS2, which are two surfaces opposite to each other in the second direction DR2, and a plurality of third recesses G3 may be defined in each of the side surfaces BS1 and BS2. The third recesses G3 may be arranged in (or adjacent each other) the first direction DR1 and may extend in the second direction DR2. For example, a pair of the third recesses G3 may be defined in each of the side surfaces BS1 and BS2 of the second and fourth supporting portions SP2 and SP4, but the number of the third recesses G3 is not limited to two.

The push units PU may be provided on the first and second supporting frames SF1 and SF2 and may extend in the second direction DR2. The end portions of the push units PU may be connected to (e.g., may contact) the first and second supporting frames SF1 and SF2 by the first pin units PIN1 and may be configured to rotate about the rotating axes RTX defined by the first pin units PIN1. Opposite end portions of the push units PU, which are adjacent to the end portions of the push units PU that contact the first and second supporting frame SF1 and SF2, may have a quarter circle shape.

As shown, four push units PU may be provided on the first and second supporting frames SF1 and SF2, but the inventive concept is not limited to any specific number of push units PU. The push units PU may be provided on the first supporting portion SP1 and on the third supporting portion SP3. The push units PU may be provided to be symmetric to each other in the second direction DR2. For example, the end portions of the push units PU may be arranged to face each other in the second direction DR2, and the opposite end portions of the push units PU may be arranged in such a way that the sides portions are interposed between the opposite end portions of the push units PU.

The push units PU may also be provided to be symmetric to each other in the first direction DR1. For example, the curved portions shaped like a quarter circle on the opposite end portions of the push units PU may be arranged to face each other in the first direction DR1. For example, the curved portions of the push units PU provided on the first supporting frame SF1 may be arranged to respectively face the curved portions of the push units PU provided on the second supporting frame SF2.

The second supporting member SM2 may include a third supporting frame SF3, a fourth supporting frame SF4, a plurality of third protruding portions P3, a plurality of fourth protruding portions P4, and a connection member CM. The third supporting frame SF3 and the fourth supporting frame SF4 may be arranged (or adjacent each other) in the first direction DR1 and may be symmetric to each other. The third supporting frame SF3 may be provided on the first supporting frame SF1, and the fourth supporting frame SF4 may be provided on the second supporting frame SF2.

The third supporting frame SF3 may have side surfaces that are opposite to each other in the second direction DR2, and the third protruding portions P3 may respectively protrude from the side surfaces of the third supporting frame SF3 in the third direction DR3. The third direction DR3 may include an upward direction and a downward direction, and the third protruding portions P3 may protrude in the upward direction. The fourth supporting frame SF4 may include side surfaces that are opposite to each other in the second direction DR2, and the fourth protruding portions P4 may protrude from the side surfaces of the fourth supporting frame SF4 in the upward direction.

The opening portions OP may be defined in the third and fourth supporting frames SF3 and SF4, and the opening portions OP may overlap the push units PU. The opening portions OP may be provided to correspond to the push units PU in a one-to-one manner, and when viewed in the third direction DR3, each of the opening portions OP may be formed to be larger than the respective push units PU. A fourth recess G4 may be defined in a bottom surface of the third supporting frame SF3 to overlap the first recess G1, and a fifth recess G5 may be defined in a bottom surface of the fourth supporting frame SF4 to overlap the second recess G2.

Sliding grooves SG may be defined in regions of the side surfaces of the third and fourth supporting frames SF3 and SF4. The regions of the side surfaces of the third supporting frame SF3 defining the sliding grooves SG may correspond to the side surfaces BS1 of the second supporting portion SP2. The regions of the side surfaces of the fourth supporting frame SF4 defining the sliding grooves SG may correspond to the side surfaces BS2 of the fourth supporting portion SP4. Each of the sliding grooves SG may extend in the first direction DR1.

The connection member CM may be placed between the third and fourth supporting frames SF3 and SF4. The connection member CM may include a first connecting portion CP1, a plurality of second connecting portions CP2, a plurality of third connecting portions CP3, and a plurality of joint units JP. The first connecting portion CP1 and the joint units JP may extend in the second direction DR2.

The joint units JP may be spaced apart from each other with the first connecting portion CP1 interposed therebetween. For example, the joint units JP may include a first group and a second group which are separated from each other by the first connecting portion CP1 being interposed therebetween. The number of the joint units JP constituting the first group may be the same as the number of the joint units JP constituting the second group, but the inventive concept is not limited thereto. For example, each of the first and second groups may include four joint units JP, but the number of the joint units JP is not limited thereto, and the first and second groups may include different numbers of joint units JP from each other.

The first group of the joint units JP may be provided between the third supporting frame SF3 and the first connecting portion CP1 in the first direction DR1. The second group of the joint units JP may be provided between the fourth supporting frame SF4 and the first connecting portion CP1 in the first direction DR1.

The second connecting portions CP2 may be arranged in the second direction DR2 and may be connected to a bottom surface of the first connecting portion CP1. The second connecting portions CP2 may each have a dual cylinder shape extending in the second direction DR2. The dual cylinder shape may have two cylindrical portions, which extend in the second direction DR2, are arranged in the first direction DR1, and are connected to each other.

A plurality of second openings H2 (e.g., second holes) extending in the second direction DR2 may be defined in each of the second connecting portions CP2. For example, the number of the second connecting portions CP2 may be two, and the number of the second openings H2 defined in each of the second connecting portions CP2 may be two. The second openings H2 may overlap the first openings H1 defined in the first and second protruding portions P1 and P2. One of the second openings H2 of each of the second connecting portions CP2 may overlap the first openings H1 defined in the first protruding portions P1, and the remaining one of the second openings H2 may overlap the first openings H1 defined in the second protruding portions P2.

The third connecting portions CP3 may be arranged in the first direction DR1 and may be provided below the first connecting portion CP1 and between the second connecting portions CP2. For example, a pair of the third connecting portions CP3 may be provided, and a plurality of third openings H3 (e.g., third holes) extending in the second direction DR2 may be defined in the third connecting portions CP3.

Each of the third connecting portions CP3 may include a body portion BP, which extends in the second direction DR2 and has a cylindrical shape, and a sub-connecting portion SC, which extends from a portion of an outer curved surface of the body portion BP in the first direction DR1. A corresponding one of the third openings H3 may be defined in each of the body portions BP, and the third openings H3 of the body portions BP may correspond to, or overlap, the second openings H2, which are respectively defined in the second connecting portions CP2, in a one-to-one manner. One of the sub-connecting portions SC of the body portions BP may be disposed in the first recess G1 and the fourth recess G4, and the other one of the sub-connecting portions SC may be disposed in the second recess G2 and the fifth recess G5.

The third supporting member SM3 may include a fifth supporting frame SF5 and a sixth supporting frame SF6. The fifth and sixth supporting frames SF5 and SF6 may be arranged in the first direction DR1 and may be symmetric to each other. The fifth supporting frame SF5 may be provided on the third supporting frame SF3, and the sixth supporting frame SF6 may be provided on the fourth supporting frame SF4.

A plurality of fourth openings H4 (e.g., fourth holes) may be defined in the third and fourth supporting frames SF3 and SF4, and a plurality of fifth openings H5 (e.g., fifth holes) corresponding to the fourth openings H4 may be defined in the fifth and sixth supporting frames SF5 and SF6. Each of the fourth openings H4 may extend in (e.g., may be elongated in) the first direction DR1. As shown in FIGS. 5 and 6, four fourth openings H4 may be defined in each of the third and fourth supporting frames SF3 and SF4, but the inventive concept is not limited to any specific number of the fourth openings H4.

In an embodiment in which each of the fifth and sixth supporting frames SF5 and SF6 has a rectangular shape, the fifth openings H5 may be provided adjacent to corners of each of the fifth and sixth supporting frames SF5 and SF6. The fifth openings H5 may overlap the fourth openings H4 and may be provided to correspond to the fourth openings H4 in a one-to-one manner. Similar to the fourth openings H4, four fifth openings H5 may be defined in each of the fifth and sixth supporting frames SF5 and SF6, but the inventive concept is not limited to any specific number of the fifth openings H5.

The supporting bars SB may be provided below the fifth and sixth supporting frames SF5 and SF6 and may extend in the third direction DR3. The supporting bars SB may be provided to overlap the opening portions OP and may be connected to (e.g., may extend from) bottom surfaces of the fifth and sixth supporting frames SF5 and SF6. The supporting bars SB may be provided to correspond to the opening portions OP in a one-to-one manner, and when viewed in the third direction DR3, each of the opening portions OP may be formed to be larger than each of the supporting bars SB.

The hinge member HGM may include a first hinge member HGM1 extending in the second direction DR2 and a second hinge member HGM2 extending in the second direction DR2. The first hinge member HGM1 and the second hinge member HGM2 may be arranged in the second direction DR2 and may be symmetric to each other. The two rotating axes RX1 and RX2 may include the first and second rotating axes RX1 and RX2, and each of the first hinge member HGM1 and the second hinge member HGM2 may provide the first and second rotating axes RX1 and RX2 for the first and second supporting members SM1 and SM2.

Each of the first and second hinge members HGM1 and HGM2 may include a pair of head portions HD and a pair of rotation pin units RPU (e.g., rotation pins), which are respectively connected to the pair of the head portions HD and extend in the second direction DR2. One head portion HD and one rotation pin unit RPU of each of the first and second hinge members HGM1 and HGM2 are connected to each other to define the first rotating axis RX1, and the remaining one of the head portions HD and the remaining one of the rotation pin units RPU of each of the first and second hinge members HGM1 and HGM2, which are connected to each other, may define the second rotating axis RX2. The pair of the head portions HD of each of the first and second hinge members HGM1 and HGM2 may be fittingly engaged to each other and may behave like a gear structure rotating about the first and second rotating axes RX1 and RX2.

The sliding units SU may be provided on the side surfaces BS1 of the second supporting portion SP2 and on the side surfaces BS2 of the fourth supporting portion SP4. Also, the sliding units SU may be provided on the regions of the side surfaces of each of the third and fourth supporting frames SF3 and SF4 defining the sliding grooves SG.

Each of the sliding units SU may include a first extension portion EX1, which has a flat surface parallel to the first direction DR1 and the third direction DR3, and a second extension portion EX2, which extends from a top portion of the first extension portion EX1 in the second direction DR2. When measured in the first direction DR1, each of the second extension portions EX2 may have a length shorter than that of the corresponding sliding grooves SG.

A plurality of sixth openings H6 (e.g., sixth holes) may be defined in the first extension portions EX1, and the sixth openings H6 may overlap the third recesses G3 in a one-to-one correspondence manner. For example, similar to the number of the third recesses G3, two sixth openings H6 may be defined in each of the first extension portions EX1, but the number of the sixth openings H6 is not limited thereto.

Figure 7:
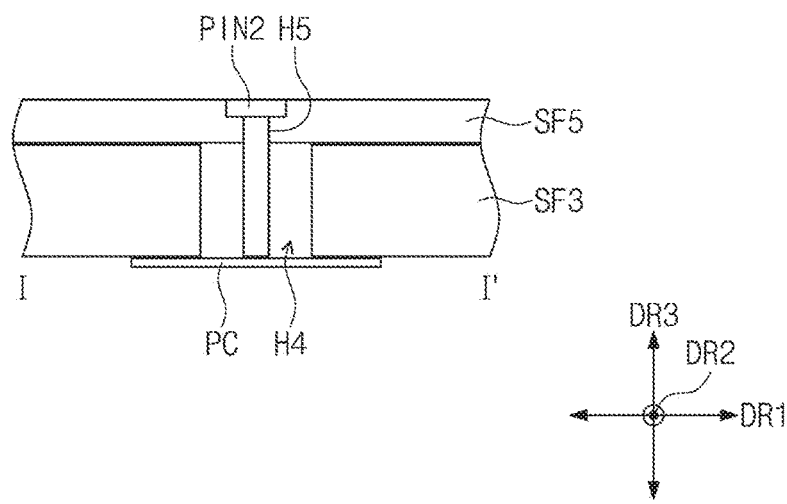
FIG. 7 is a sectional view taken along the line I-I' of FIG. 5.

FIG. 7 is a sectional view taken along the line I-I' of FIG. 5.

Referring to FIG. 7, the fifth supporting frame SF5 may be provided on the third supporting frame SF3, and the fifth opening H5 may overlap the fourth opening H4. A second pin unit PIN2 (e.g., a second pin) may be inserted into the fifth opening H5 and the fourth opening H4 and may be connected to a pin coupling unit PC provided below the third supporting frame SF3. When measured in the first direction DR1, a width of the fourth opening H4 may be wider or larger than that of the fifth opening H5. When viewed in the third direction DR3, the pin coupling unit PC may be larger than the fourth opening H4. Thus, when measured in the first direction DR1, the pin coupling unit PC may have a greater width than that of the fourth opening H4.

The third supporting frame SF3 and the fifth supporting frame SF5 may be connected to each other by the second pin unit PIN2 and the pin coupling unit PC. Although the connection configuration between the fourth supporting frame SF4 and the sixth supporting frame SF6 is not described, these components may be connected to each other in the same manner as the third supporting frame SF3 and the fifth supporting frame SF5. For example, a plurality of the second pin units PIN2 and a plurality of the pin coupling units PC may be prepared, and the second supporting member SM2 and the third supporting member SM3 may be connected to each other by the second pin units PIN2 and the pin coupling units PC.

The second pin unit PIN2 may be configured to move (e.g., to reciprocate) in the first direction DR1 within the space of the fourth opening H4. When the first and second supporting members SM1 and SM2 are out-folded about the hinge member HGM, the fifth and sixth supporting frames SF5 and SF6 connected to the second pin units PIN2 may move (e.g., may reciprocate) in the first direction DR1 on the third and fourth supporting frames SF3 and SF4 in the fourth opening H4. Accordingly, the third supporting member SM3 connected to the second pin units PIN2 may move (e.g., may reciprocate) in the first direction DR1 in the fourth openings H4.

Figure 8:
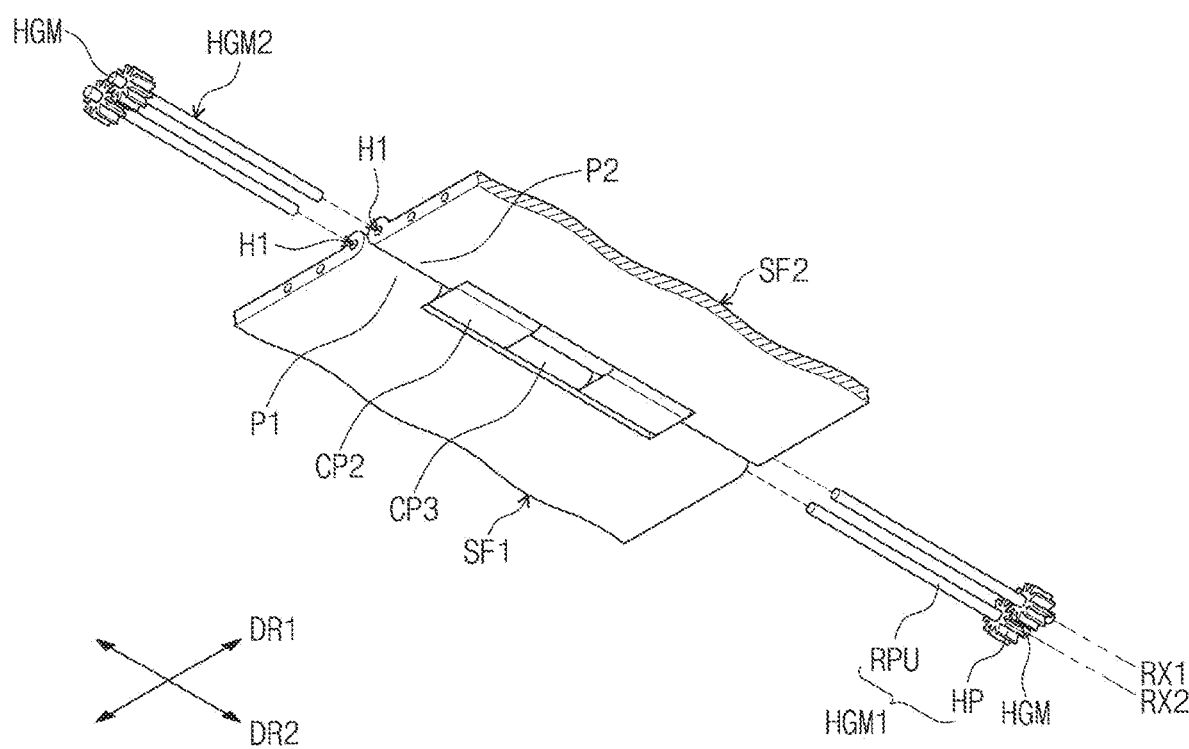
FIG. 8 is a diagram illustrating a coupling configuration of a first supporting member and a second supporting member shown in FIGS. 5 and 6.

FIG. 8 is a diagram illustrating a coupling structure of the first supporting member SM1 and the second supporting member SM2 shown in FIGS. 5 and 6.

Referring to FIG. 8, to connect the first supporting member SM1 to the second supporting member SM2, the first supporting member SM1 may be disposed below the second supporting member SM2. The first protruding portions P1 and the second protruding portions P2 may be provided below the first connecting portion CP1, and the second and third connecting portions CP2 and CP3 may be provided between the first protruding portions P1 and between the second protruding portions P2. The first openings H1 may overlap the second openings H2, and the second openings H2 may overlap the third openings H3.

Because the first supporting member SM1 is provided below the second supporting member SM2 in FIG. 8, the sub-connecting portions SC are not visible in FIG. 8. However, when the first supporting member SM1 is provided below the second supporting member SM2, one of the sub-connecting portions SC may be provided in the first and fourth recesses G1 and G4 and the remaining one of the sub-connecting portions SC may be provided in the second and fifth recesses G2 and G5, as described above. The sub-connecting portions SC may be connected to the third and fourth supporting frames SF3 and SF4 to support the third and fourth supporting frames SF3 and SF4.

When first and second hinge members HGM1 and HGM2 are inserted into the first openings H1 of the first and second protruding portions P1 and P2, the second openings H2 of the second connecting portions CP2, and the third openings H3 of the third connecting portions CP3, the first and second hinge members HGM1 and HGM2 may be moved in opposite directions in such a way that they become closer to each other in the second direction DR2.

The rotation pin units RPU of the first and second hinge members HGM1 and HGM2 may be inserted into the first openings H1, the second openings H2, and the third openings H3. The rotation pin units RPU of the first hinge member HGM1 may be inserted into the first openings H1 of an adjacent pair of the first and second protruding portions P1 and P2 and into the second openings H2 of a corresponding one of the second connecting portion CP2 adjacent to the pair of the first and second protruding portions P1 and P2. The rotation pin units RPU of the second hinge member HGM2 may be inserted into the first openings H1 of the other pair of the first and second protruding portions P1 and P2 and into the second openings H2 of the remaining one of the second connecting portion CP2.

The rotation pin units RPU of the first and second hinge members HGM1 and HGM2 may be inserted into the third openings H3 and may have end portions facing each other in the third openings H3. Accordingly, the first and second supporting members SM1 and SM2 may be connected to each other and may be configured to rotate about the first and second rotating axes RX1 and RX2 when the supporting member 200 is folded.

Figure 9:
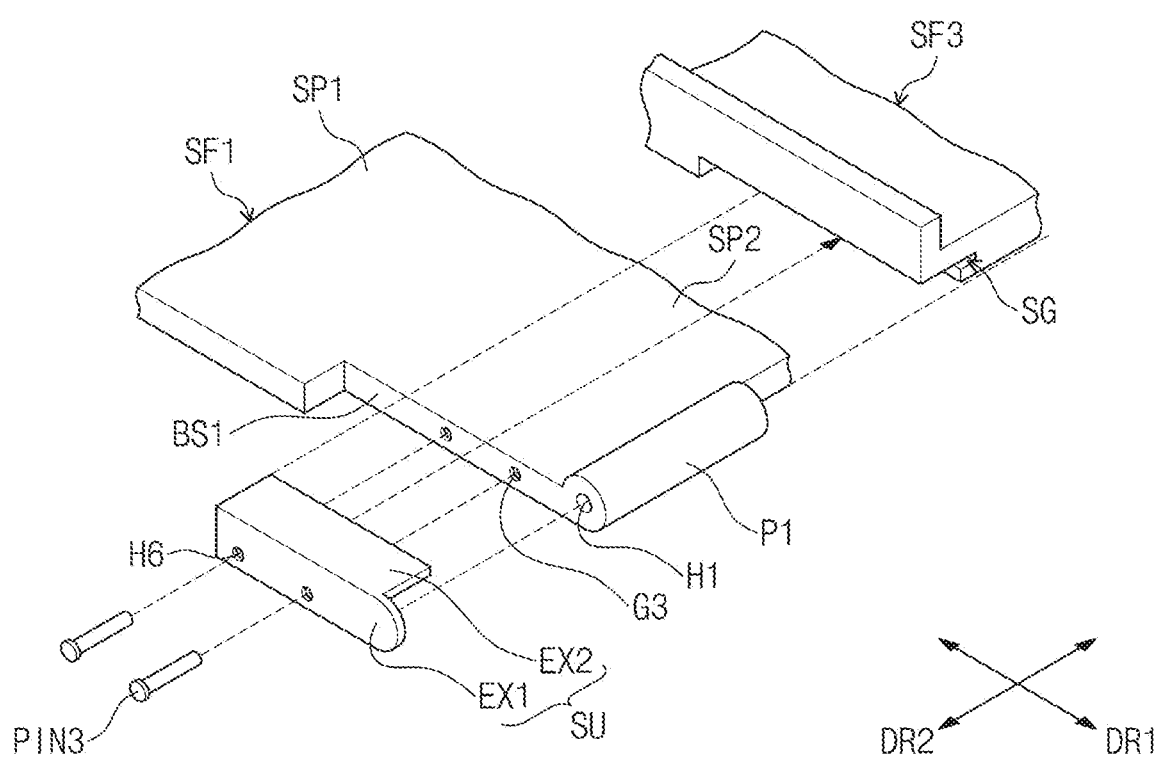
FIG. 9 is a diagram illustrating a coupling configuration of sliding units and the first supporting member shown in FIGS. 5 and 6.

FIG. 9 is a diagram illustrating a connection structure between the sliding units SU shown in FIGS. 5 and 6 and the first supporting member SM1.

For convenience in illustration, only one of the sliding units SU is illustrated in FIG. 9, but the other sliding units SU may be connected to the first supporting member SM1 in the same manner as the sliding unit SU shown in FIG. 9.

Referring to FIG. 9, the first extension portion EX1 of the sliding unit SU may be provided on a corresponding one of the side surfaces BS1 of the second supporting portion SP2. The sixth openings H6 defined in the first extension portion EX1 may overlap the third recesses G3 defined in the side surface BS1.

Third pin units PIN3 (e.g., third pins) may be inserted into the sixth openings H6 and the third recesses G3 to connect the first extension portion EX1 to the side surface BS1, thereby connecting the sliding unit SU to the first supporting frame SF1. For example, the first extension portions EX1 may be connected to the side surfaces BS1 of the second supporting portion SP2 and the side surfaces BS2 of the fourth supporting portion SP4 through the third pin units PIN3, and thus, the sliding units SU may be connected to the first supporting member SM1.

The second extension portion EX2 may be inserted into a corresponding one of the sliding grooves SG. For example, the second extension portions EX2 may be inserted into respective ones of the sliding grooves SG. Because, when measured in the first direction DR1, a length of each of the second extension portions EX2 is shorter than that of each of the sliding grooves SG, the third supporting frame SF3 may move along the second extension portion EX2 when the second extension portion EX2 is inserted into the sliding groove SG.

Figure 10:
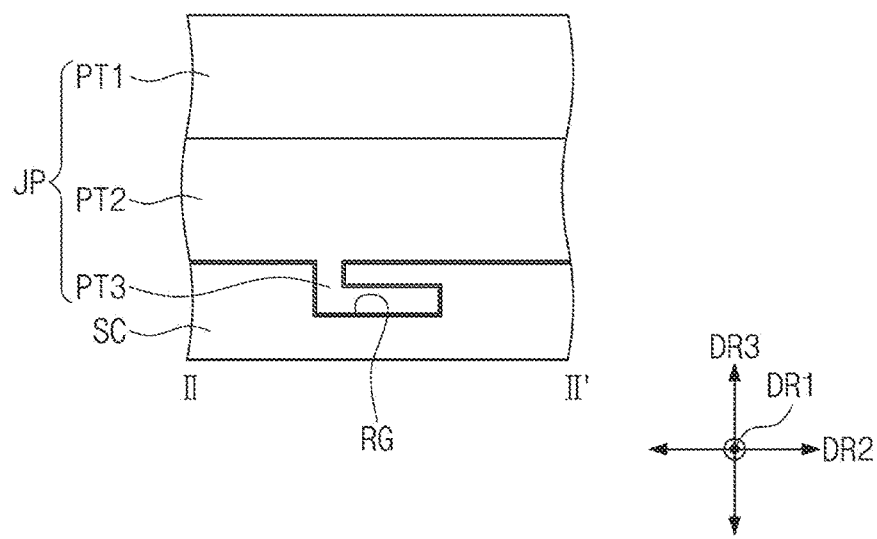
FIG. 10 is a sectional view taken along the line II-II' of FIG. 6.
Figure 11:
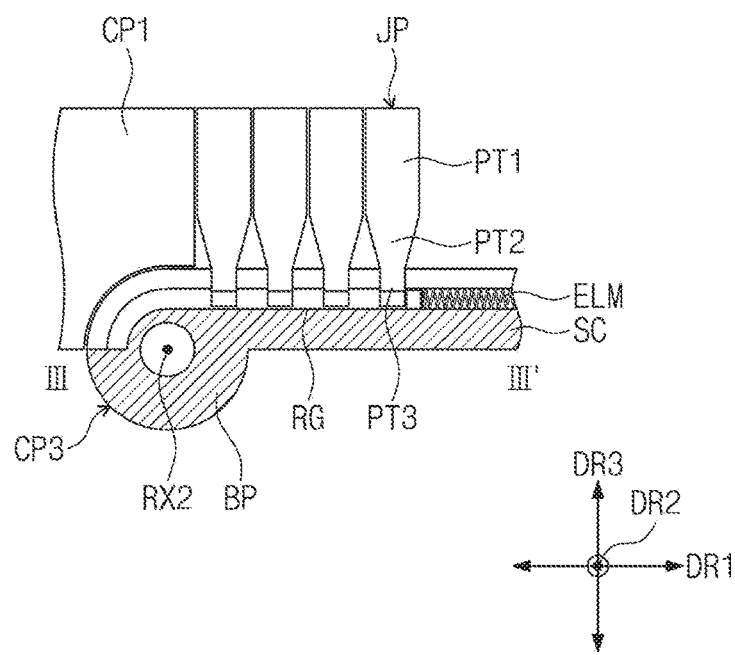
FIG. 11 is a sectional view taken along the line III-III' of FIG. 6.

FIG. 10 is a sectional view taken along the line II-II' of FIG. 6. FIG. 11 is a sectional view taken along the line III-III' of FIG. 6.

FIGS. 10 and 11 are diagrams illustrating a connection structure between the joint units JP and the third connecting portions CP3.

FIG. 10 illustrates sections of the joint unit JP and the sub-connecting portion SC when viewed in the first direction DR1, and FIG. 11 illustrates sections of the joint units JP and the third connecting portion CP3 when viewed in the second direction DR2.

Referring to FIGS. 10 and 11, each of the joint units JP may include a first portion PT1, which has a rectangular shape when viewed in the second direction DR2, a second portion PT2 provided below the first portion PT1, and a third portion PT3 provided below the second portion PT2.

When viewed in the second direction DR2, each of the second portions PT2 may have a trapezoid shape, and when measured in the first direction DR1, a width of each of the second portions PT2 may decrease in a direction from a top of each of the second portions PT2 to a bottom thereof (e.g., in the third direction DR3). Each of the third portions PT3 may have an "L"-shaped section when viewed in the first direction DR1. The others of the joint units JP may be configured to have the same structure as the joint unit JP shown in FIG. 10.

A rail groove RG may be defined in a top surface of the third connecting portion CP3. The rail groove RG may extend in the first direction DR1 and may extend from a portion of a top surface of a sub-connecting portion SC to a portion of an outer circumference of the body portion BP. The rail groove RG may have an "L"-shaped section when viewed in the first direction DR1.

FIG. 11 illustrates the joint units JP and the third connecting portion CP3 that are provided at a right side of the first connecting portion CP1 in the first direction DR1, but the joint units JP and the third connecting portion CP3 that are provided at a left side of the first connecting portion CP1 may have the same or substantially the same structure and/or configuration as the joint units JP and the third connecting portion CP3 that are provided at the right side of the first connecting portion CP1 shown in FIG. 11.

The third portions PT3 of the joint units JP may be inserted into the rail groove RG of the third connecting portion CP3. The third connecting portion CP3 may include an elastic member ELM, which is provided in the rail groove RG, and the elastic member ELM may be provided at a right side of the third portion PT3 of the rightmost one of the joint units JP. When the second supporting member SM2 is folded, the elastic member ELM may push the joint units JP toward a center of the supporting member 200, and the joint units JP may be moved along the rail groove RG.

The elastic member ELM may also be provided in the rail groove RG of the third connecting portion CP3, which is placed at a left side of the first connecting portion CP1. The elastic member ELM provided at the left side of the first connecting portion CP1 may be positioned adjacent to a left side of the third portion PT3 of the leftmost one of the joint units JP provided at the left side of the first connecting portion CP1.

Figure 12:
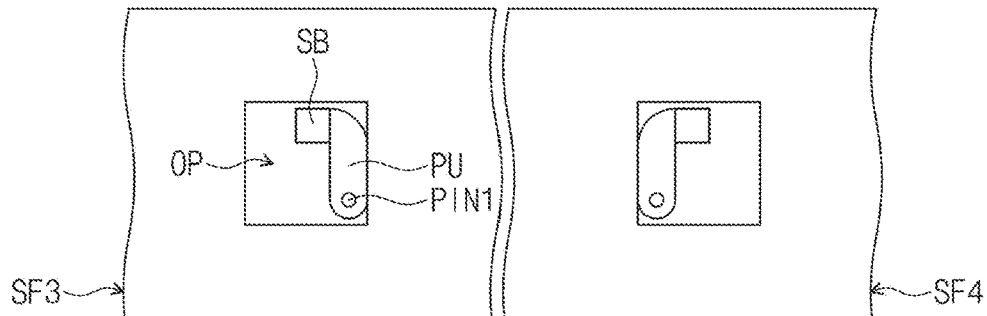
FIG. 12 is a diagram illustrating push units and supporting bars in opening portions shown in FIGS. 5 and 6.
Figure 12:
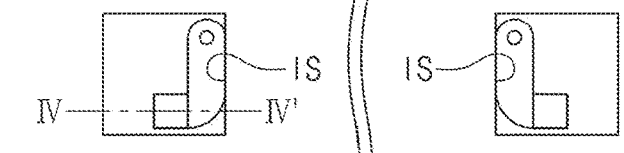
Figure 12:
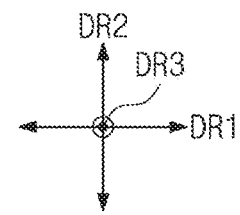
Figure 13:
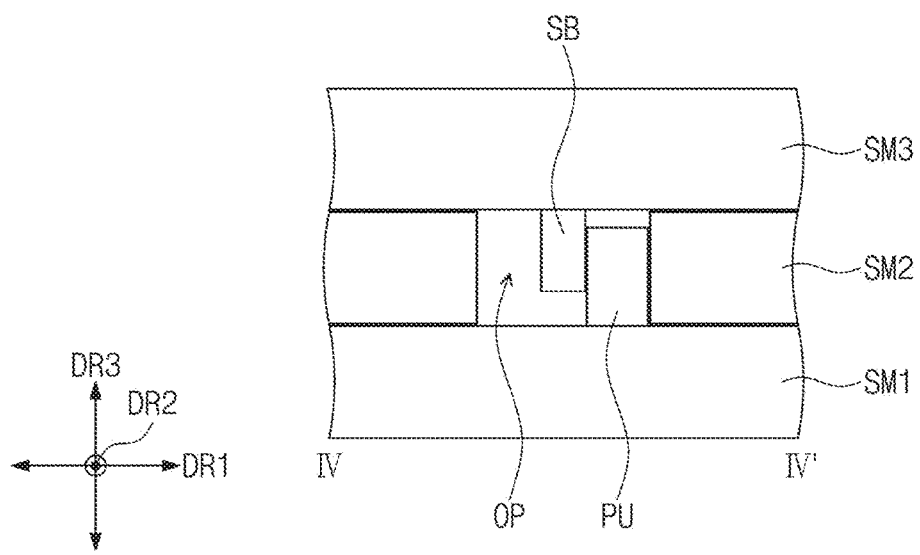
FIG. 13 is a sectional view taken along the line IV-IV' of FIG. 12.

FIG. 12 is a diagram illustrating the push units PU and the supporting bars SB shown in FIGS. 5 and 6 being arranged in the opening portions OP. FIG. 13 is a sectional view taken along the line IV-IV' of FIG. 12.

FIG. 12 illustrates positions and arrangements of the push units PU and the supporting bars SB when viewed in a top plan view of the supporting member 200 (e.g., when viewed in the third direction DR3).

Referring to FIGS. 12 and 13, the push units PU and the supporting bars SB may be provided in the opening portions OP. On a plane defined by the first and second directions DR1 and DR2, an area of each of the opening portions OP may be larger than a sum of an area of the respective push units PU and an area of the respective supporting bars SB. When measured in the first direction DR1, a length of each of the opening portions OP may be longer or larger than a sum of a length of the respective push units PU and a length of the respective supporting bars SB.

The push units PU may be closer to the two rotating axes RX1 and RX2 than the supporting bars SB are. The first pin units PIN1 may extend through the end portions of the push units PU, and the supporting bars SB may be provided adjacent to the opposite end portions of the push units PU. The supporting bars SB may be provided to be in contact with side surfaces of the push units PU adjacent to the opposite end portions of the push units PU.

Each of the opening portions OP may have a rectangular shape. The third and fourth supporting frames SF3 and SF4 may have inner side surfaces defining the opening portions OP, and the inner side surfaces may be connected to each other to form a rectangular shape. The inner side surfaces of the third and fourth supporting frames SF3 and SF4 may include inner side surfaces IS, which are closer to the two rotating axes RX1 and RX2 than the other inner side surfaces are, and the push units PU may be provided on or adjacent the inner side surfaces IS. The push units PU may be provided to be in contact with the inner side surfaces IS. Each of the push units PU may be provided between a corresponding one of the inner side surfaces IS and a corresponding one of the supporting bars BP.

Figure 14:
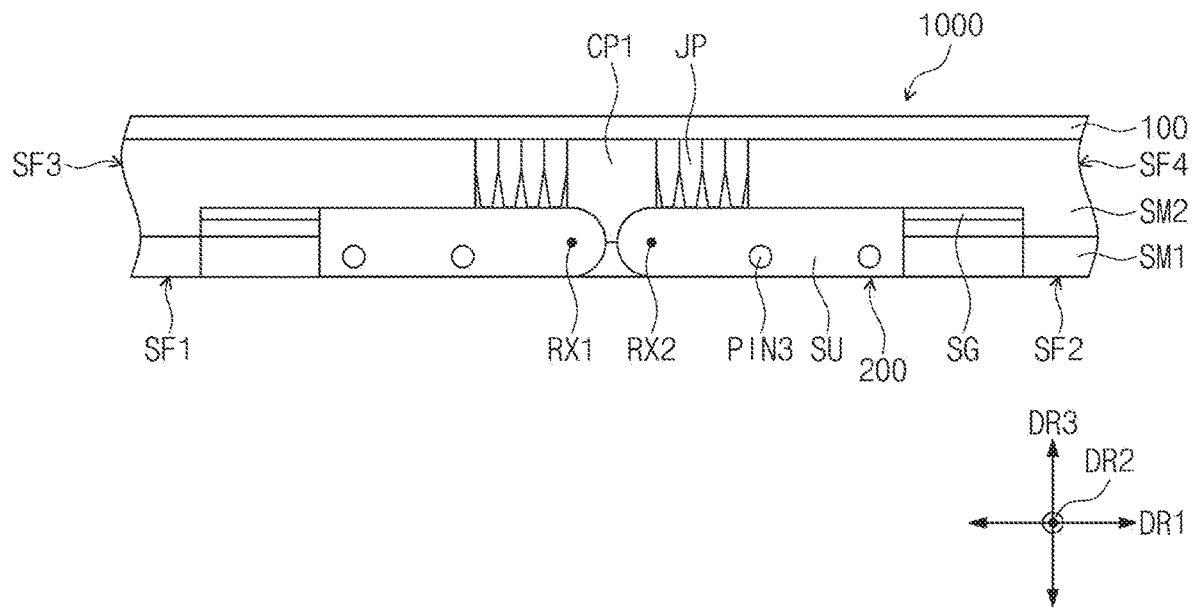
FIGS. 14-16 are sectional views illustrating a folding action of a display device according to an embodiment of the inventive concept.
Figure 15:
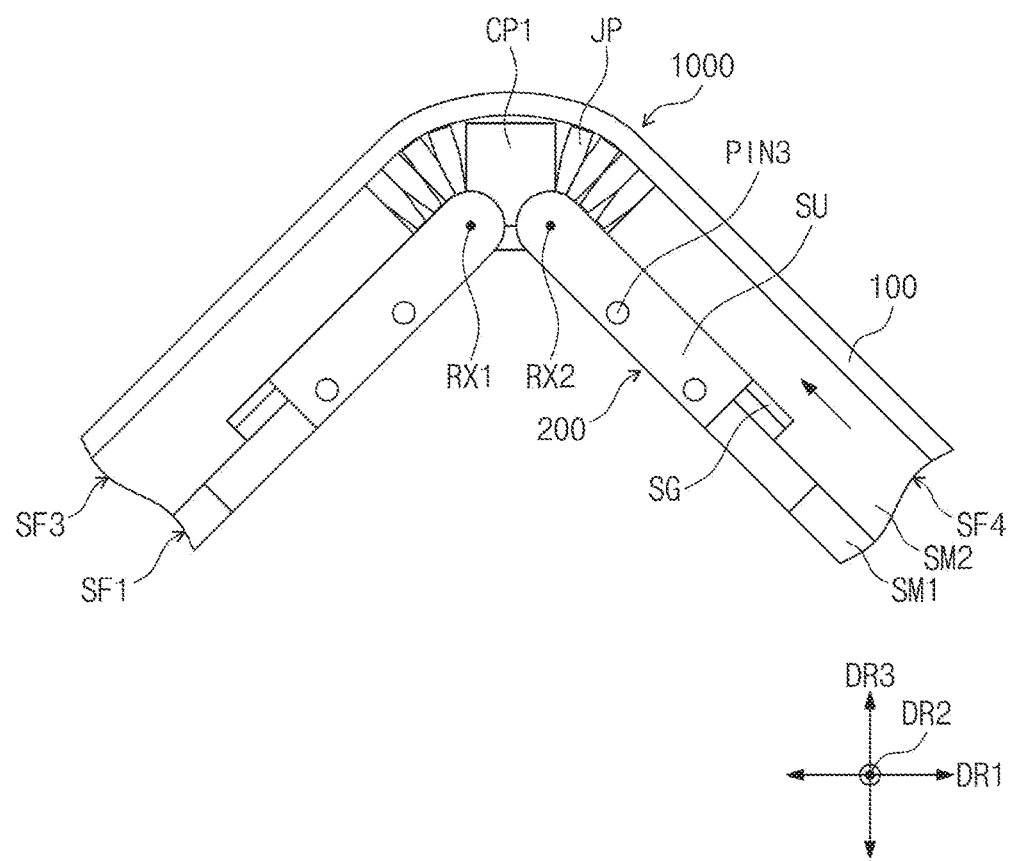
Figure 16:
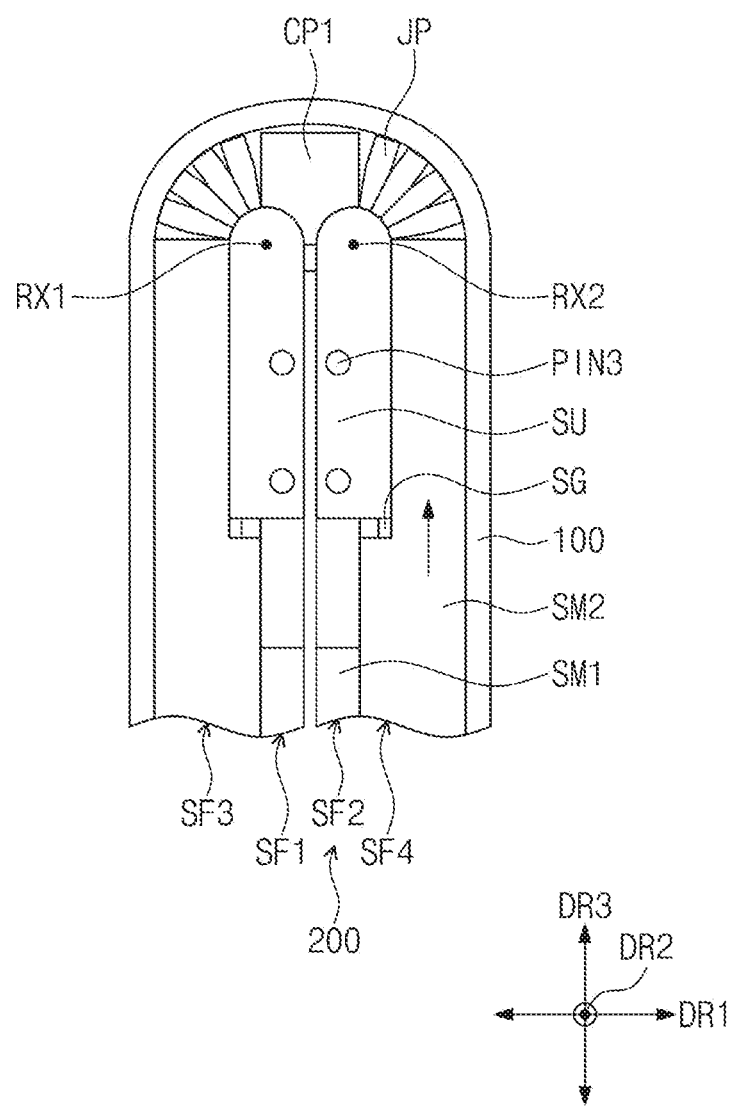

FIGS. 14-16 are sectional views illustrating folding states of a display device according to an embodiment of the inventive concept.

For convenience in illustration, a cross-sectional view of the display device 1000 is illustrated in FIGS. 14-16.

Referring to FIGS. 14-16, the first, second, third supporting members SM1, SM2, and SM3, the hinge member HGM, the sliding units SU, the push units PU, and the supporting bars SB of the supporting member 200 shown in FIGS. 5 and 6 may be coupled to each other, and the display module 100 may be provided on the third supporting member SM3. The display module 100 may be attached to the third supporting member SM3 by an adhesive layer. The folding region FA of the display module 100 may overlap the hinge member HGM, and the two non-folding regions NFA of the display module 100 may be provided on the fifth and sixth supporting frames SF5 and SF6 of the third supporting member SM3.

The display device 1000 may be configured to be rotated about the first and second rotating axes RX1 and RX2 defined by the hinge members HGM, and the display device 1000 may be rotated about the first and second rotating axes RX1 and RX2 in an out-folding manner (e.g., to expose the display surface DS of the display module 100 to the outside). When the display device 1000 is folded, the second supporting member SM2 may be moved toward a center of the display device 1000 relative to the first supporting member SM1.

For example, when the display device 1000 is folded, the third and fourth supporting frames SF3 and SF4 of the second supporting member SM2 may move toward the center of the display device 1000 relative to the first and second supporting frames SF1 and SF2 of the first supporting member SM1. Similarly, the fifth and sixth supporting frames SF5 and SF6 may be moved toward the center of the display device 1000 relative to the first and second supporting frames SF1 and SF2.

The third and fourth supporting frames SF3 and SF4 may move along the second extension portions EX2 of the sliding units SU provided in the sliding grooves SG. As described in FIG. 7, when the display device 1000 is folded, the third supporting member SM3 connected to the second pin units PIN2 may be moved along the fourth opening H4.

When the display device 1000 is folded, the joint units JP may move along the rail groove RG, as described with respect to FIGS. 10 and 11. When the display device 1000 is folded, the second portions PT2 of the joint units JP may contact each other, and the first portions PT1 of the joint units JP may be spaced apart from each other.

Figure 17:
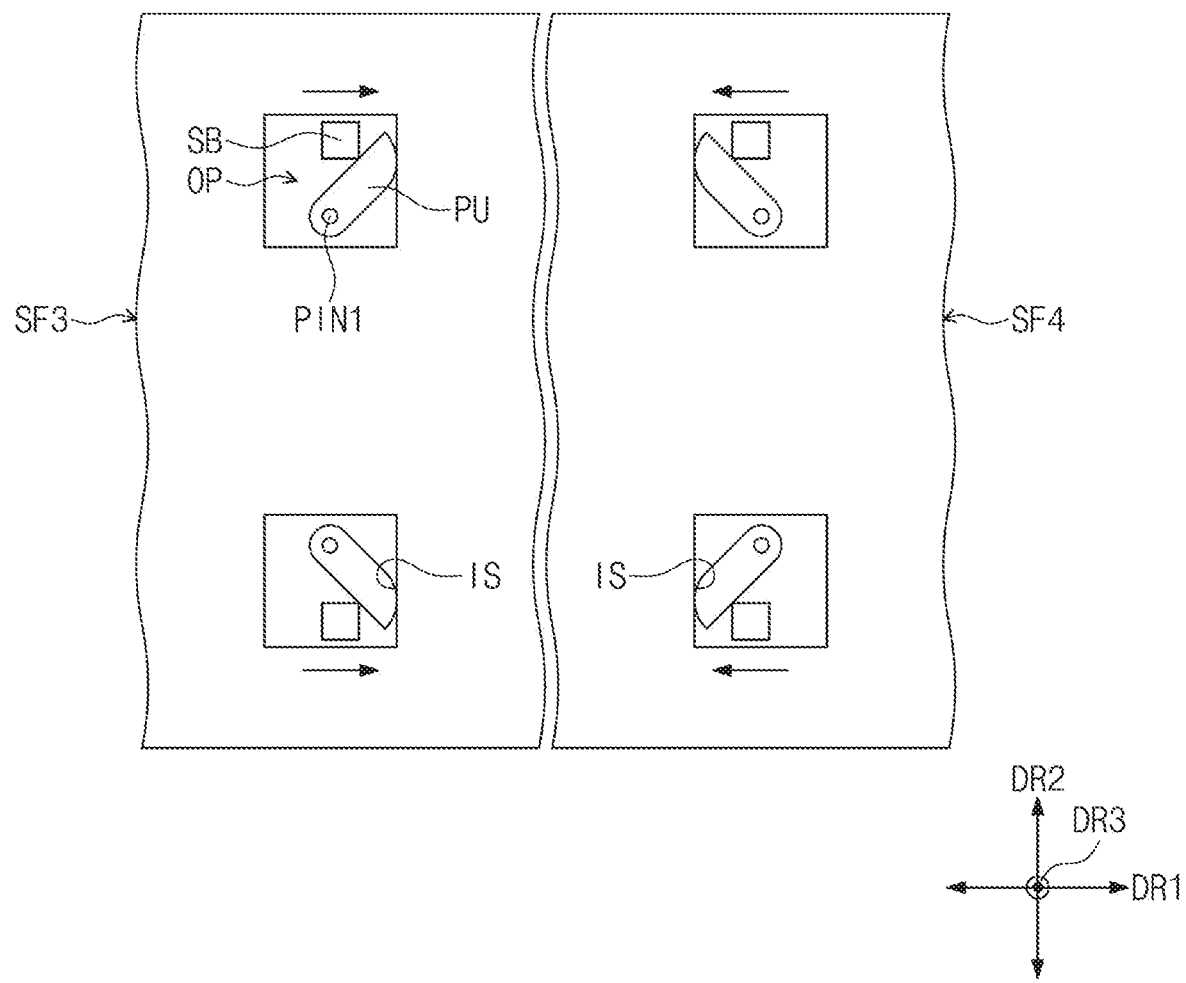
FIG. 17 is a diagram illustrating a change in arrangement of push units and supporting bars to fold the display device shown in FIG. 16.
Figure 18:
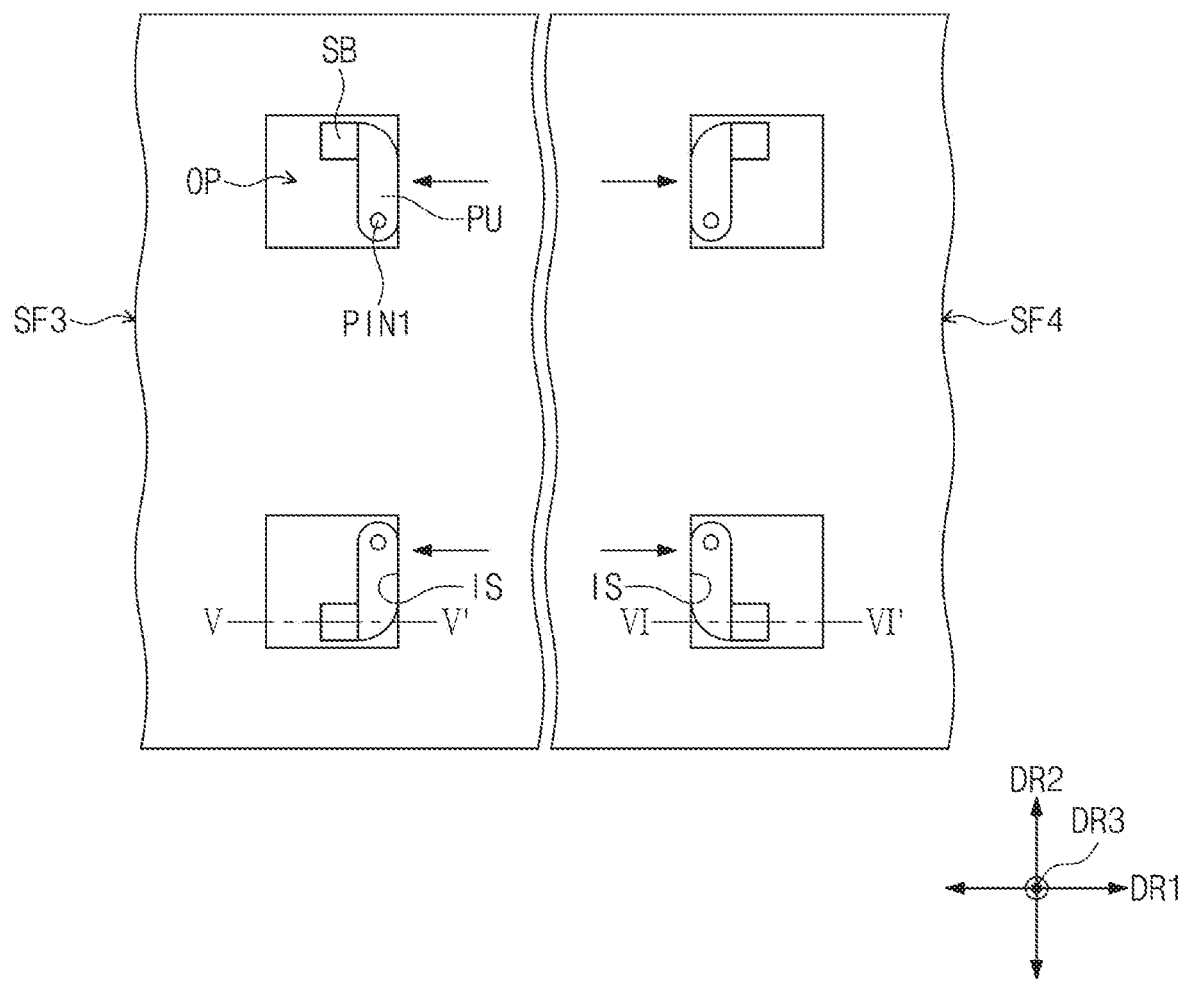
FIG. 18 is a diagram illustrating a change in arrangement of push units and supporting bars to unfold the display device shown in FIG. 14.
Figure 19:
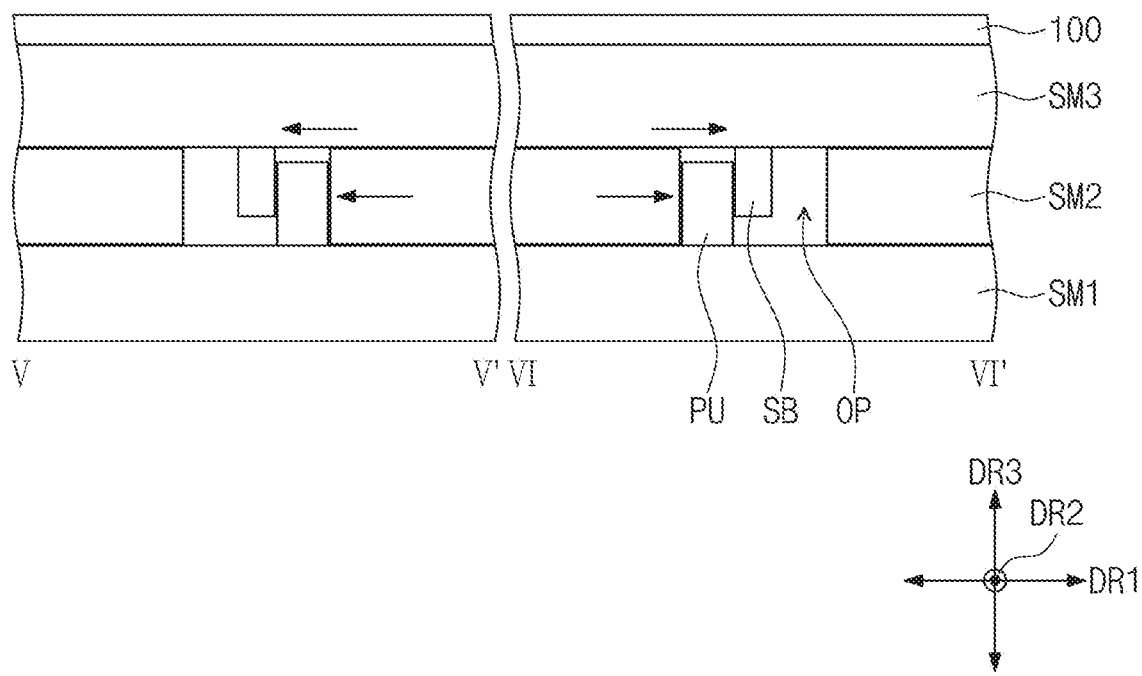
FIG. 19 is a sectional view taken along the lines V-V and VI-VI' of FIG. 18.

FIG. 17 is a diagram illustrating a change in arrangement of the push units PU and the supporting bars SB when the display device 1000 is folded as shown in FIG. 16. FIG. 18 is a diagram illustrating a change in arrangement of the push units PU and the supporting bars SB when the display device 1000 is unfolded as shown in FIG. 14. FIG. 19 is a sectional view taken along the lines V-V and VI-VI' of FIG. 18.

Referring to FIG. 17, as described above, when the display device 1000 is folded, the third and fourth supporting frames SF3 and SF4 and the fifth and sixth supporting frames SF5 and SF6 may move toward the center of the display device 1000 relative to the first and second supporting frames SF1 and SF2. Thus, the supporting bars SB may urge or move the push units PU toward the center of the display device 1000.

Referring to FIGS. 18 and 19, when the display device 1000 is unfolded, the third and fourth supporting frames SF3 and SF4 may move away from the center of the display device 1000 relative to the first and second supporting frames SF1 and SF2.

The inner side surfaces IS of the third and fourth supporting frames SF3 and SF4 may be configured to push the push units PU in a direction away from the center of the display device 1000. Also, the push units PU may be configured to push the supporting bars SB in a direction away from the center of the display device 1000. Accordingly, the display module 100 attached to the fifth and sixth supporting frames SF5 and SF6 may be unfolded.

When the folded display device 1000 is unfolded, the folding region FA of the display module 100 may be deformed (e.g., stretched or compressed). In some embodiments, when the display device 1000 is unfolded, the inner side surfaces IS may move the push units PU in a direction away from the center of the display module 100, and the push units PU may move the supporting bars SB in a direction away from the center of the display module 100, and thus, the folding region FA of the display module 100 may have a substantially flat surface without being deformed in the unfolded state.

For example, according to some embodiments of the inventive concept, because the folding region FA of the display module 100 is unfolded to be substantially flat, the folding region FA may not be deformed.

According to some embodiments of the inventive concept, a supporting member of a display device may be configured to unfold a folding region of a display module to be substantially flat, and thus, the folding region may not be deformed.

While example embodiments of the inventive concept have been particularly shown and described, it will be understood by one of ordinary skill in the art that variations in form and detail may be made therein without departing from the spirit and scope of the following claims and their equivalents.

What is claimed is:

1. A display device comprising:
   a first support;
   a second support on the first support and having a plurality of openings therein;
   a plurality of push units on and connected to the first support and in the openings of the second support;
   a third support on the second support;
   a display module on the third support;
   a hinge to provide a plurality of rotating axes that extend in a second direction; and
   a plurality of supporting bars connected to the third support and being in the openings,
   wherein each of the push units is configured to rotate about a respective individual rotating axis that extends through an end portion of the respective push unit in a third direction crossing a plane parallel to a first direction and the second direction, the first direction crossing the second direction, and
   wherein the push units push the supporting bars in a direction away from the center of the display module.

2. The display device of claim 1, wherein the end portions of the push units face each other in the second direction, and wherein the supporting bars are on side surfaces of the push units that are adjacent to opposite end portions of the push units, the opposite end portions of the push units being opposite the end portions of the push units.

3. The display device of claim 2, wherein each of the openings have a rectangular shape defined by respective inner side surfaces of the second support, and
   wherein the push units are on ones of the inner side surfaces that are closer to the rotating axes of the hinge from among the inner side surfaces of the second support.

4. The display device of claim 1, wherein opposite end portions of the push units have a quarter circle shape with a curved surface, and the curved surfaces of the opposite end portions of the push units face each other in the first direction.

5. The display device of claim 1, wherein, when viewed in the third direction, an area of each of the openings is larger than a sum of an area of the one of the push units and an area of the one of the supporting bars in the corresponding one of the openings, and
   wherein a length of each of the openings in the first direction is longer than a sum of a length of the one of the push units and a length of the one of the supporting bars in the corresponding one of the openings.

6. The display device of claim 1, further comprising a plurality of first pins connecting the push units to the first support, the first pins extending through the end portions of the push units.

7. The display device of claim 1, wherein the first support comprises:
   a first supporting frame;
   a plurality of first protruding portions protruding from a side surface of the first supporting frame;
   a second supporting frame spaced apart from the first supporting frame in the first direction; and
   a plurality of second protruding portions protruding from a side surface of the second supporting frame, the side surface of the second supporting frame facing the side surface of the first supporting frame,
   wherein each of the first and second protruding portions has a cylindrical shape extending in the second direction, and
   wherein each of the first and second protruding portions has a first opening therein extending in the second direction.

8. The display device of claim 7, wherein the second support comprises:
   a third supporting frame on the first supporting frame;
   a fourth supporting frame on the second supporting frame; and
   a connection member between the third supporting frame and the fourth supporting frame to connect the third supporting frame to the fourth supporting frame.

9. The display device of claim 8, wherein the connection member comprises:
   a first connecting portion;
   a plurality of joint units spaced apart from each other with the first connecting portion therebetween;
   a plurality of second connecting portions connected to a bottom surface of the first connecting portion and adjacent each other in the second direction, the second connecting portions having a plurality of second openings extending therethrough in the second direction; and
   a plurality of third connecting portions below the first connecting portion and between the second connection portions, the third connecting portions having a plurality of third openings extending therethrough in the second direction,
wherein the second and third connecting portions are between the first protruding portions and between the second protruding portions, and the hinge extends into the first openings, the second openings, and the third openings.

10. The display device of claim 9, wherein each of the joint units comprises:
a first portion having a rectangular shape when viewed in the second direction; and
a second portion below the first portion, the second portion having a trapezoidal shape when viewed in the second direction; and
a third portion below the second portion,
wherein the third portions extend into rail grooves in top surfaces of the third connecting portions.

11. The display device of claim 10, wherein the third connecting portions comprise elastic members that are in the rail grooves and adjacent to a left side of the third portion of a leftmost one of the joint units and a right side of the third portion of a rightmost one of the joint units.

12. The display device of claim 9, wherein each of the third connecting portions comprises:
a body portion having a cylindrical shape extending in the second direction, a corresponding one of the third openings being in the body portion; and
a sub-connecting portion extending from a portion of an outer circumference of the body portion in the first direction, and
wherein the sub-connecting portions are connected to bottom surfaces of the third supporting frame and the fourth supporting frame.

13. The display device of claim 9, wherein the hinge comprises a first hinge member and a second hinge member arranged in the second direction,
wherein each of the first and second hinge members comprises:
a pair of head portions; and
a pair of rotation pins connected to the pair of head portions, the rotation pins extending in the second direction,
wherein the rotating axes of the hinge comprise a first rotating axis and a second rotating axis,
wherein the pair of head portions and the pair of rotation pins act as the first rotating axis and the second rotating axis for rotation of the first and second supports,
wherein the rotation pins are inserted into the first openings, the second openings, and the third openings, and
wherein the pair of head portions are fittingly engaged with each other to behave like a gear structure rotating about the first and second rotating axes.

14. The display device of claim 8, wherein the first supporting frame comprises:
a first supporting portion; and
a second supporting portion extending from the first supporting portion in the first direction,
wherein the second supporting frame comprises:
a third supporting portion; and
a fourth supporting portion extending from the third supporting portion in the first direction,
wherein a width of each of the second and fourth supporting portions in the second direction is smaller than a width of each of the first and second supporting portions,
wherein a side surface of the second supporting portion is a part of the side surface of the first supporting frame, and
wherein a side surface of the fourth supporting portion is a part of the side surface of the second supporting frame.

15. The display device of claim 14, further comprising a plurality of sliding units that are connected to side surfaces of the second supporting portion that are opposite to each other in the second direction and to side surfaces of the fourth supporting portion that are opposite to each other in the second direction.

16. The display device of claim 15, wherein each of the sliding units comprises:
a first extension portion having a flat surface parallel to the first direction and the third direction; and
a second extension portion extending from a top portion of the first extension portion in the second direction,
wherein the first extension portions are respectively connected to the side surfaces of the second supporting portion and to the side surfaces of the fourth supporting portion,
wherein the second extension portions are inserted into a plurality of sliding grooves, the sliding grooves being in portions of side surfaces of the third supporting frame corresponding to the side surfaces of the second supporting portion and in portions of side surfaces of the fourth supporting frame corresponding to the side surfaces of the fourth supporting portion, and
wherein a length of each of the second extension portions in the first direction is less than that of each of the sliding grooves.

17. The display device of claim 8, wherein the third support comprises:
a fifth supporting frame on the third supporting frame; and
a sixth supporting frame on the fourth supporting frame,
wherein the third and fourth supporting frames have a plurality of fourth openings therein,
wherein the fifth and sixth supporting frames have a plurality of fifth openings therein, ones of the fifth openings overlapping ones of the fourth openings, and
wherein a width of each of the fourth openings in the first direction is wider than a width of each of the fifth openings.

18. The display device of claim 17, further comprising:
a plurality of second pins in the fourth openings and the fifth openings; and
a plurality of pin coupling units below the third and fourth supporting frames and coupled with the second pins,
wherein each of the pin coupling units is larger in the third direction than each of the fifth openings.

19. The display device of claim 1, wherein the rotating axes of the hinge comprise a first rotating axis and a second rotating axis extending parallel to the second direction, and
wherein the first and second supports are configured to be folded about the rotating axes of the hinge in an out-folding manner to expose the display module to an outside.

20. The display device of claim 1, wherein the hinge is connected to center portions of the first and second supports that overlap a folding region of the display module, the first and second supports being configured to rotate about the rotating axes, and
wherein the push units are closer to the rotating axes of the hinge than the supporting bars.

21. The display device of claim 1, wherein inner side surfaces of the openings in the second support that are closer to the rotating axes from among inner side surfaces of the second support pushes the push units in the direction away from a center of the display module.

* * * * *